United States Patent [19]
Suzuki et al.

[11] Patent Number: 6,132,852
[45] Date of Patent: Oct. 17, 2000

[54] MULTILAYER WIRING SUBSTRATE AND METHOD FOR PRODUCTION THEREOF

[75] Inventors: Masahiro Suzuki, Iwaki; Akio Takahashi, Hitachiota; Minoru Tanaka, Yokohama; Haruhiko Matsuyama, Hiratsuka; Haruo Akahoshi, Hitachi, all of Japan

[73] Assignee: Hitachi, Ltd., Tokyo, Japan

[21] Appl. No.: 09/267,166

[22] Filed: Mar. 12, 1999

[30] Foreign Application Priority Data

Mar. 13, 1998 [JP] Japan .................................. 10-062513

[51] Int. Cl.$^7$ ........................... B32B 15/00; B32B 27/00; B05D 3/02; H01B 7/00
[52] U.S. Cl. ..................... 428/209; 428/458; 428/473.5; 428/615; 528/170; 528/310; 528/322; 528/327; 525/421; 525/422; 525/426; 427/385.5; 427/388.1; 264/171.15; 174/110 SR; 174/258
[58] Field of Search .................................. 528/322, 170, 528/327, 310; 428/458, 473.5, 209, 615; 525/422, 421, 426; 174/110 SR, 258; 427/385.5, 388.1; 264/171.15

[56] References Cited

U.S. PATENT DOCUMENTS

| | | | |
|---|---|---|---|
| 4,745,215 | 5/1988 | Cox et al. | 525/424 |
| 5,208,656 | 5/1993 | Matsuyama et al. | 174/253 |
| 5,280,102 | 1/1994 | Matsuyama et al. | 528/353 |
| 5,565,706 | 10/1996 | Miura et al. | 257/723 |
| 5,686,191 | 11/1997 | Miwa et al. | 428/473.5 |
| 5,768,108 | 6/1998 | Miura et al. | 361/792 |
| 5,851,681 | 12/1998 | Matsuyama et al. | 428/458 |

FOREIGN PATENT DOCUMENTS

| | | |
|---|---|---|
| 476589 B1 | 6/1996 | European Pat. Off. . |
| 6128462 | 5/1984 | Japan . |
| 60143649 | 7/1985 | Japan . |
| 3-205474 | 9/1991 | Japan . |
| 4227960 | 8/1992 | Japan . |
| 6145639 | 5/1994 | Japan . |
| 8181450 | 7/1996 | Japan . |
| 9246724 | 9/1997 | Japan . |
| 9326556 | 12/1997 | Japan . |

*Primary Examiner*—P. Hampton-Hightower
*Attorney, Agent, or Firm*—Antonelli, Terry, Stout & Kraus, LLP

[57] ABSTRACT

A multilayer wiring substrate using a resin composition comprising polyquinoline compound and bismaleimide compound as essential ingredients between wiring-carrying resin layers as insulating layers forms no void at the time of lamination, has an excellent adhesive property at various interfaces, has a heat stability after lamination and is high in reliability, so that, it is applicable to many fields not only including the multilayer wiring substrates capable of mounting LSI or tip carrier directly but also including multilayer wiring substrate for work station, mounting substrates for small-sized electronic devices such as camera and video for people's use, and high frequency multitip module multilayer substrate.

12 Claims, 5 Drawing Sheets

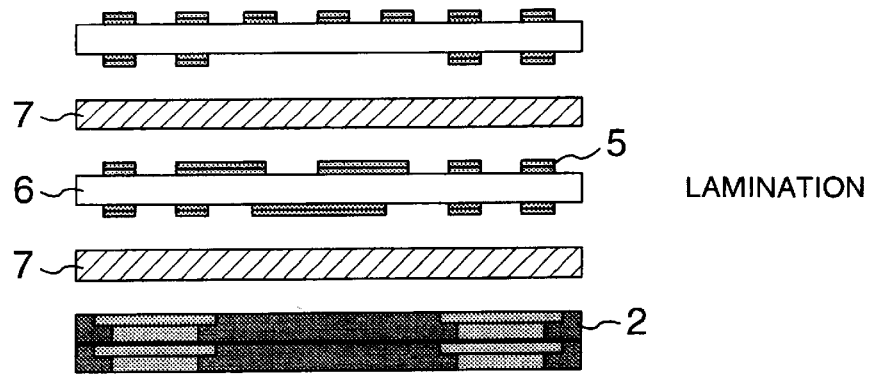
FIG. 3A   LAMINATION
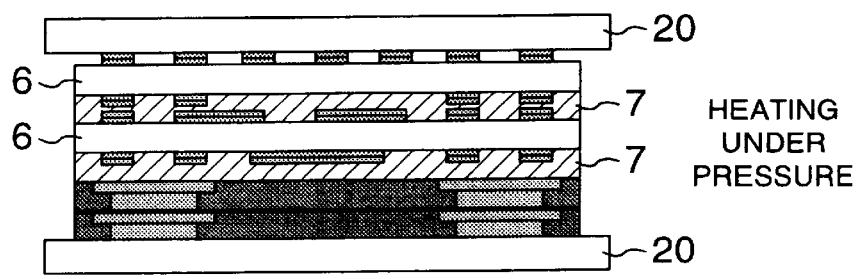
FIG. 3B   HEATING UNDER PRESSURE
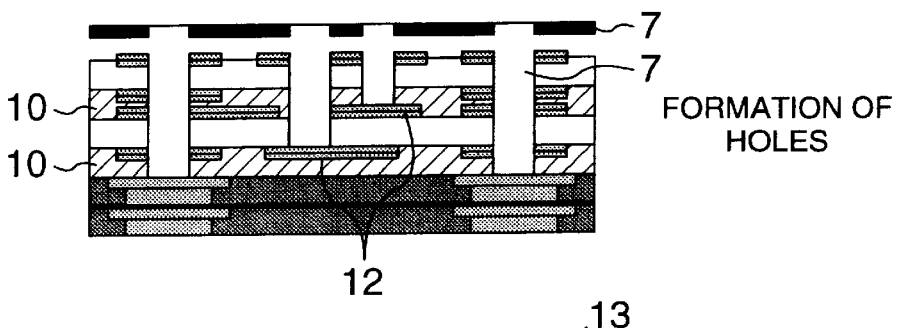
FIG. 3C   FORMATION OF HOLES
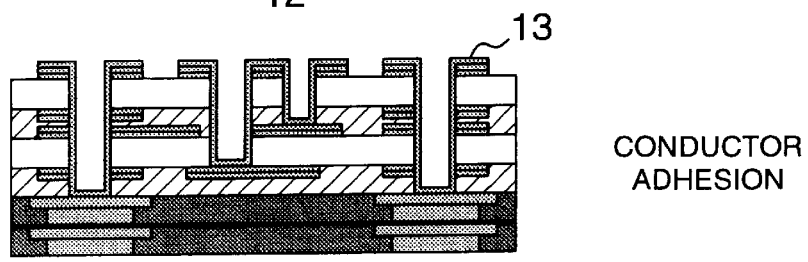
FIG. 3D   CONDUCTOR ADHESION
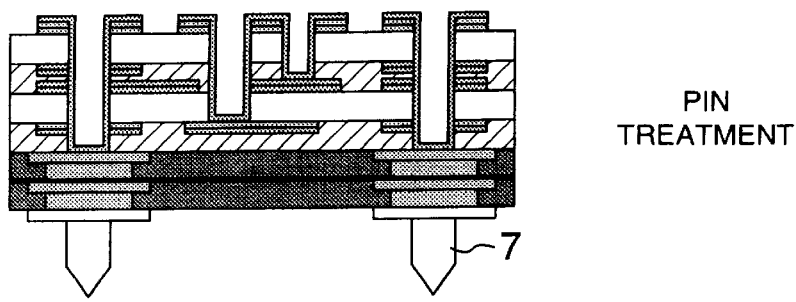
FIG. 3E   PIN TREATMENT

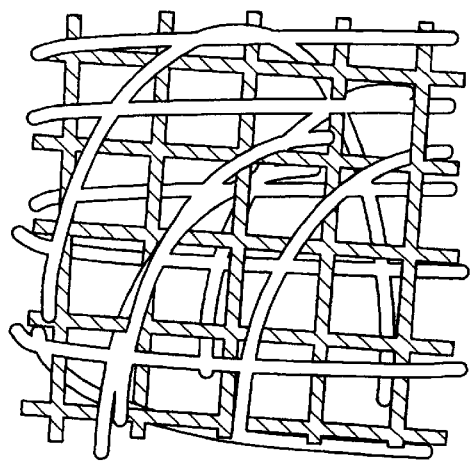
FIG. 4A MIXED STATE
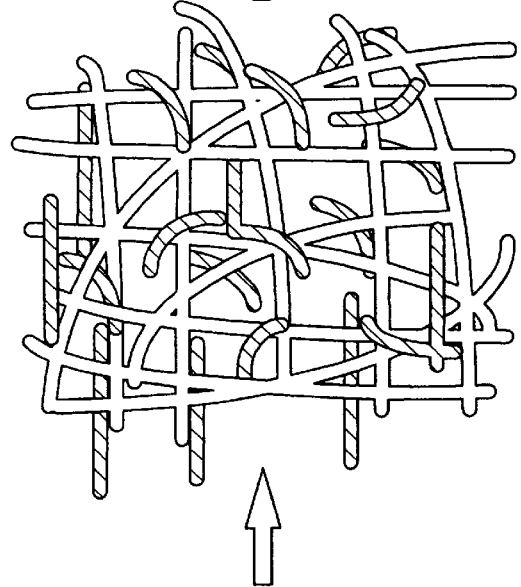
FIG. 4B SEMI-CURED
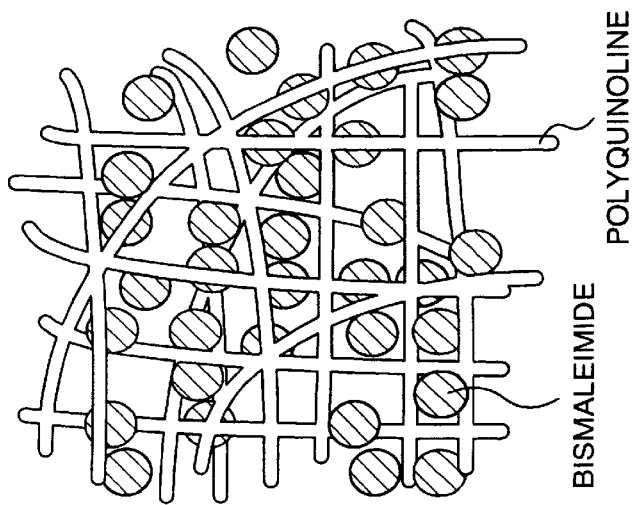
FIG. 4C CURED
BISMALEIMIDE   POLYQUINOLINE

MATERIAL CONSTITUTION

HEAT UNDER PRESSURE

FORMATION OF HOLES

CONDUCTOR FILM FORMATION

RESIST FORMATION

PEELING OF ETCHING RESIST

MULTILAYER WIRING SUBSTRATE AND METHOD FOR PRODUCTION THEREOF

BACKGROUND OF THE INVENTION

The present invention relates to a multilayer wiring substrate for use in electronic computer or for various mounting uses.

In the field of mounting module substrate used for enhancing the operation speed of electronic computer, enhancement of the speed of signal transmission is an important problem.

In the prior module substrate, thick film multilayer wiring substrates obtained by forming low-conductivity wiring layers of W, Mo or the like by the ceramics lamination-sintering process have been used predominantly. With the aim of enhancing the signal transmission sped, however, multilayer thin-film wiring substrates prepared by forming an interlaminar insulation film of polyimide resin having a low dielectric constant on a ceramics multilayer wiring substrate and providing a conductor layer of Cu, Al, Au or the like having a high conductivity are watched with interest in the recent time (JP-A 60-143649). However, polyimide resins are generally inferior in adhesive performance and moldability in spite of excellence in high temperature stability, due to which reliability of polyimide-derived articles cannot sufficiently be secured. As a method for improving moldability thereof, there has been disclosed a thermosetting resin composition prepared by adding a bismaleimide compound or the like to a specified polyimide (JP-A 3-205474). There has also been disclosed an adhesive material prepared by adding a thermosetting resin to a polyimide having a low softening point (JP-A 4-227960).

JP-A 9-326556 discloses a technique for manufacturing a multilayer wiring substrate by repeating coating of an organic resin and a heat treatment, formation of through holes and attachment of metallic conductor, and formation of wiring pattern on an organic resin insulating layer.

JP-A 8-181450 discloses a technique for manufacturing a multilayer wiring substrate which comprises laminating a thermosetting polyimide resin having a wiring pattern on an adhesive sheet made of a thermoplastic polyimide resin, followed by heating and contact bonding.

Prior adhesive materials have secured fluidity by using a thermosetting resin composition prepared by adding bismaleimide or the like to a specified polyimide, as a means for improving the adhesiveness to a material to be bonded. However, in such a method, the step of imidating polyamic acid (precursor of polyimide) requires a temperature higher than the polymerization temperature of bismaleimide compound, and at such a high temperature the thermosetting resin such as bismaleimide undergoes a thermal polymerization, as a result of which no sufficient fluidity can be exhibited. Further, the resin mentioned above is apt to absorb water when allowed to stand at ambient temperature, and the absorbed water vaporizes to form gaseous steam in the steps of curing and heat treatment to cause interlaminar swelling, interlaminar peeling, etc.

Further, although an adhesive material prepared by adding a thermosetting resin to a thermoplastic polyimide is excellent in fluidity, it is low in elastic modulus at a temperature higher than the glass transition temperature of thermoplastic polyimide, so that the adhesive material portion softens in the step of soldering of LSI and the like, due to which breakage of wiring, interlaminar swelling, etc. take place. Further, this resin exhibits a great dimensional change at a temperature higher than the glass transition temperature of thermoplastic polyimide used, and the relative position between the wirings extremely changes, and this makes an important trouble in obtaining a wiring of high density and high reliability.

BRIEF SUMMARY OF THE INVENTION

It is an object of the present invention to provide a multilayer wiring substrate in which excellent fluidity and pattern-embedding performance are exhibited by an adhesive sheet or an insulating resin layer at the time of bonding and a high adhesive force is exhibited at the interfaces between different materials such as conductor, resin, ceramics, etc.

According to the prior method of production, a multilayer wiring substrate is produced while forming an insulating layer and a circuit from an organic resin in a layer-by-layer manner. Thus, the production takes a very long period of time. Further, in a method of piling up a plurality of wiring pattern-carrying sheets by the use of adhesive sheets of thermoplastic polyimide resin, the above-mentioned trouble is developed in the heat-applying steps.

It is another object of the present invention to provide a method for producing a multilayer wiring substrate of high reliability which can overcome the faults mentioned above and can much shorten the process of the production.

Thus, the present invention provides a multilayer wiring substrate comprising resin layers having conductor wiring thereon and at least one insulating resin layer interposed between individual resin layers, said insulating resin layer being made from bismaleimide and polyquinoline.

The present invention also provides a process for producing such a multilayer wiring substrate.

BRIEF DESCRIPTION OF THE DRAWINGS

FIGS. 3A to 3E are sectional views illustrating the method for producing a multilayer wiring substrate of Example 7.

FIGS. 4A to 4C are outlined views illustrating the state of change of the resin composition comprising a bismaleimide compound and a polyquinoline compound.

DETAILED DESCRIPTION OF THE INVENTION

Figure 1:
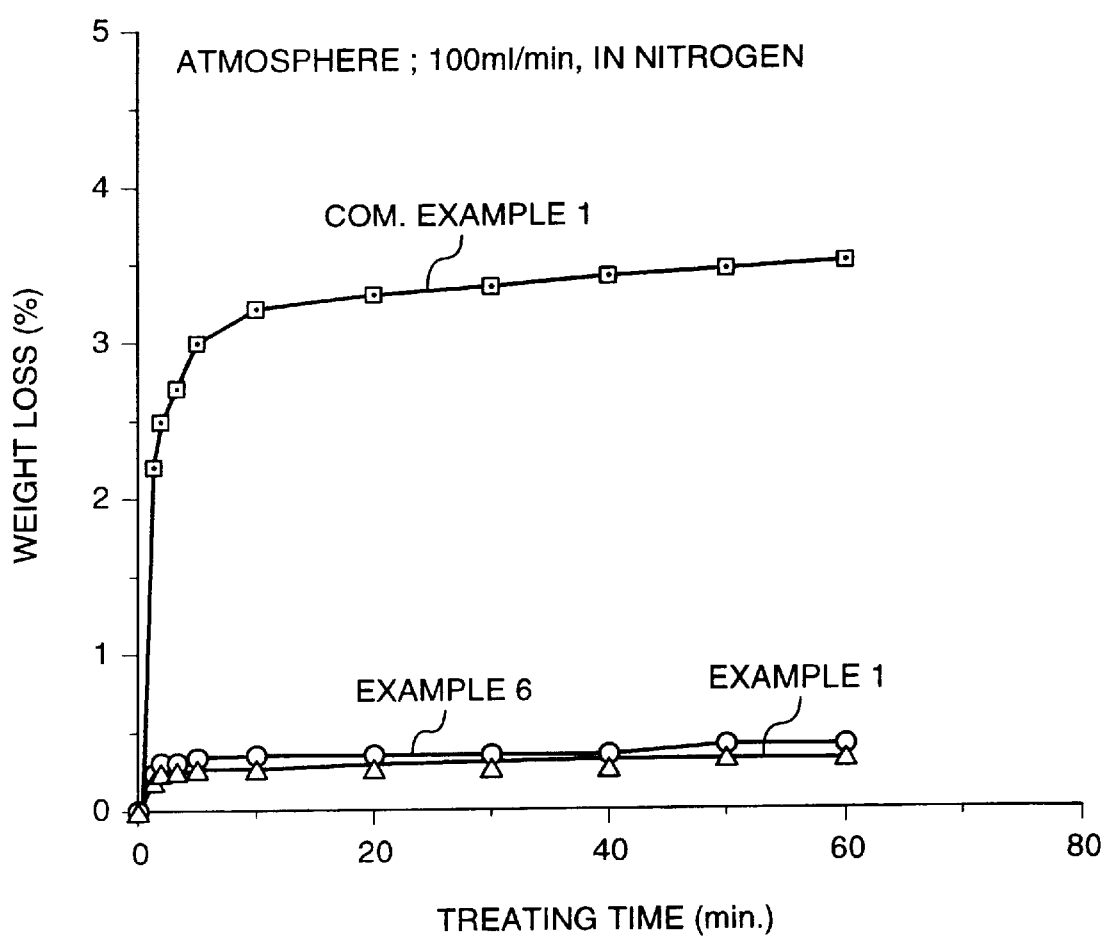
FIG. 1 is a graph illustrating the relation between weight loss upon heating and time in an adhesive sheet which is cured and thereafter heated at 330° C. in a nitrogen gas atmosphere flowing at a rate of 100 ml/minute.
Figure 2A:
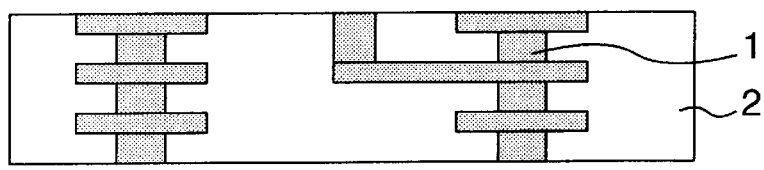
FIG. 2A to 2E are sectional views illustrating one example of the method for producing a multilayer wiring substrate according to the present invention which comprises lamination using adhesive sheets.
Figure 2B:
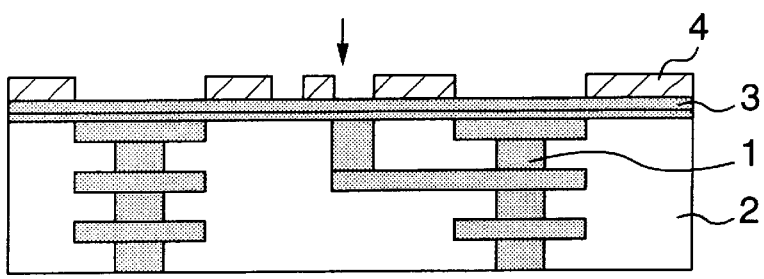
Figure 2C:
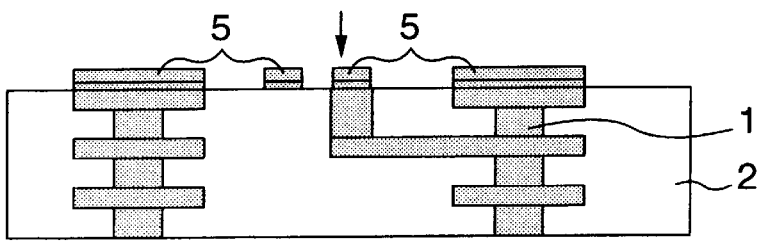
Figure 2D:
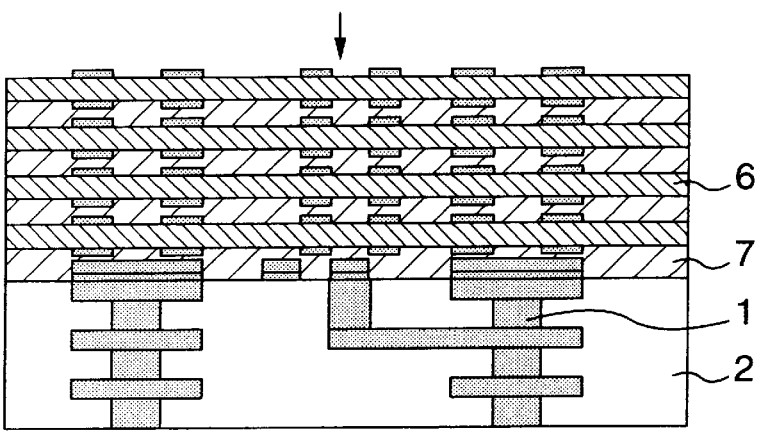
Figure 2E:
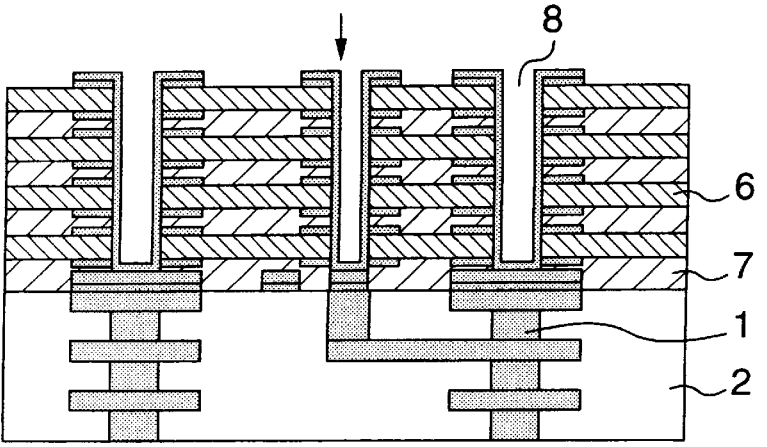
Figure 5A:
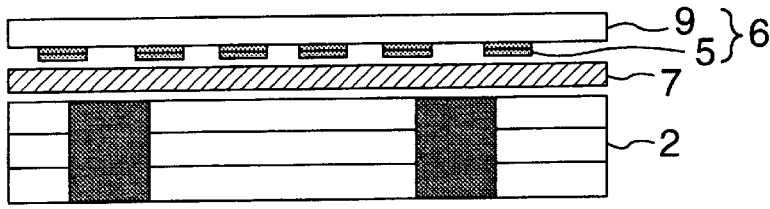
FIGS. 5A to 5F are sectional views illustrating the method for producing a multilayer wiring substrate of Example 8.
Figure 5B:
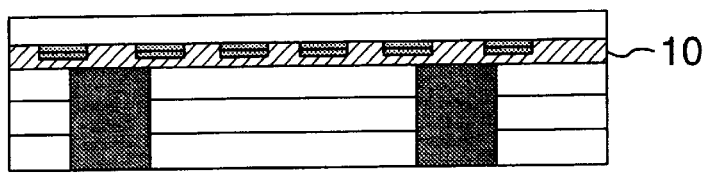
Figure 5C:
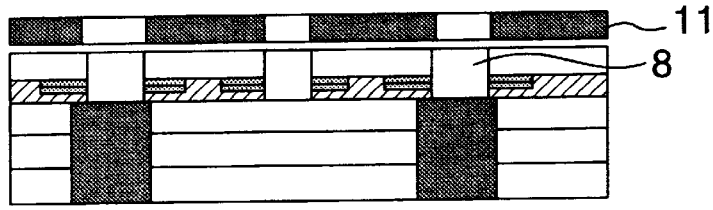
Figure 5D:
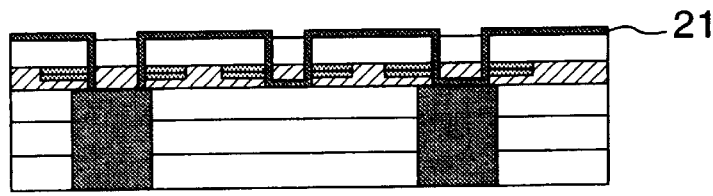
Figure 5E:
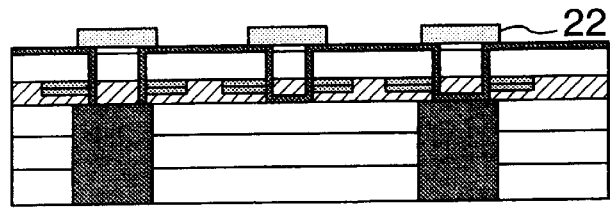
Figure 5F:
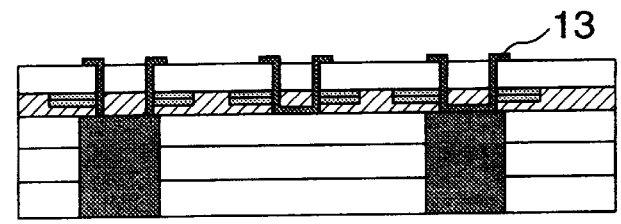

In order to achieve the objects mentioned above, a characteristic feature of the present invention consists in that, in a multilayer wiring substrate prepared by laminating resin layers having conductor wiring thereon and at least one insulating resin layer interposed between individual resin layers the insulating resin layer comprises a bismaleimide compound and a polyquinoline compound.

A further characteristic feature of the present invention consists in that the bismaleimide compound contained in the insulating resin layer contains a compound having the following formula (1) in the structure thereof:

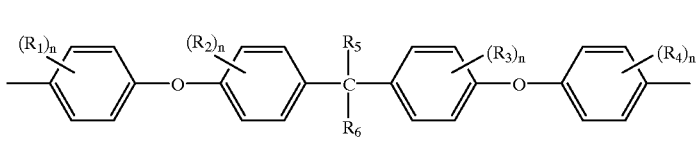

(1)

wherein $R_1$ to $R_6$, identical or different each other, independently represents any one of H, $CH_2$, $CH_3$, $C_2H_5$, $C_3H_7$, F, $CF_3$ and $C_2F_5$; and n, identical or different each other, represents 0 or an integer of 1 to 4.

Another characteristic feature of the present invention consists in that the polyquinoline compound contained in the insulating resin layer contains at least one compound selected from those having the following formulas (2) and (3) in the structure thereof:

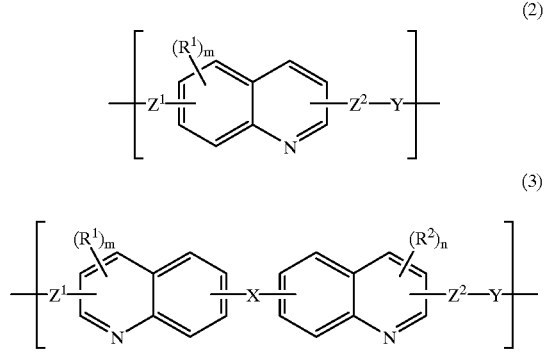

(2)

(3)

wherein $R^1$ and $R^2$ independently represents an alkyl group, an aryl group, an alkoxy group, an aryloxy group, a formyl group (—COR), an ester group (—COR or —OCOR), an amido group (—NRCOR or —CONRR), a heteroaryl group, a cyano group or, taken in conjunction of two members of $R^1$ and $R^2$, a divalent hydrocarbon group which may have an unsaturated bond, provided that R represents a hydrogen atom, an alkyl group or a heteroaryl group; m and n independently represent an integer of from 0 to 5; X represents direct link, —O—, —S—, —CO—, SO—, —$SO_2$—, —A—, (O—A—)$_q$—O— or —O— in which q is an integer of from 1 to 3; A represents —Ar— (an arylene group), —Hr— (a heteroarylene group), —Ar—O—Ar—, —CO—Ar—, Ar—S—Ar—, —Ar—SO—Ar—, —Ar— or —Ar—Q—Ar—; Q represents the following formula:

in which $L_1$ and $L_2$ represent a methyl group, a trifluoromethyl group or, taken in conjunction of two members of $L_1$ and $L_2$, a divalent hydrocarbon group which may have an unsaturated bond; $Z^1$ and $Z^2$ independently represents direct link or an arylene group; and Y represents —O— or —O—A—O—.

In the above-mentioned groups, those having 1 to 40 carbon atoms, preferably 1 to 30 carbon atoms, and more preferably 1 to 20 carbon atoms are useful.

The alkyl group includes, for example, methyl, ethyl, propyl, isopropyl, butyl, sec-butyl, tert-butyl, pentyl, cyclopentyl, hexyl, cyclohexyl, heptyl, octyl, 2-ethylhexyl, decyl, undecyl, dodecyl, dococyl, etc.

The alkoxy group includes, for example, those derived from the alkyl groups mentioned above.

The aryl group includes, for example, phenyl, biphenyl, naphthyl, anthracenyl, diphenylphenyl, etc.

The aryloxy group includes, for example, those derived from the above-mentioned aryl groups.

The heteroaryl group includes, for example, pyridyl, quinonydyl, pyrazyl, etc.

The arylene group includes, for example, phenylene, biphenylene, naphthylene, anthracenylene, diphenylphenylene, etc.

The heteroarylene group includes, for example, pyridylene, quinolinidylene, pyrazilene, etc.

Yet another characteristic feature of the present invention consists in that an insulating resin layer comprising a bismaleimide compound and a polyquinoline compound is interposed between a wiring-carrying resin layer and a polyimide multilayer wiring substrate, a glass ceramics multilayer wiring substrate, an alumina ceramics multilayer wiring substrate or a mullite glass multilayer wiring substrate.

Still another characteristic feature of the present invention consists in that a multilayer wiring substrate is produced by laminating a wiring-carrying film or resin layer prepared by forming a wiring pattern on an insulating film and an insulating resin layer or adhesive film containing a bismaleimide compound and a polyquinoline compound, and pressing and heating the laminate of the wiring-carrying film and the adhesive film.

Still another characteristic feature of the present invention consists in that a multilayer wiring substrate is produced by drilling a hole through a laminate formed from the above-mentioned wiring-carrying film or resin layer, the above-mentioned adhesive film or insulating resin layer and the polyimide multilayer wiring substrate, glass ceramics multilayer wiring substrate, alumina ceramics multilayer wiring substrate or mullite glass multilayer wiring substrate, followed by attaching a conductor to the inside wall of the hole, and forming a metallic conductor on the polyimide multilayer wiring substrate, glass ceramics multilayer wiring substrate, alumina ceramics multilayer wiring substrate or mullite glass multilayer wiring substrate. The hole is drilled by the method of laser processing, dry etching, etc. In carrying out the dry etching, a mask having a through-hole at the position of hole drilling is used. If desired, the wiring itself of the wiring-carrying film may be used as a mask.

When a resin composition comprising a bismaleimide compound and a polyquinoline compound as essential ingredients is heated, the bismaleimide compound first melts in the process of heating, and the polyquinoline compound dissolves therein to form a uniformly dissolved (compatible) mixture. In the process of heating, a decrease of elastic modulus of the composition takes place. In this state, the polyquinoline does not react but merely dissolves in the bismaleimide compound. That is, there is no factor of reaction, so that the composition can retain a sufficient fluidity. Further, the bismaleimide compound reacts and cures at the thermal polymerization temperature thereof, and therefore the volatile loss can be lessened to 1% or less.

That is, by piling up two or more layers of the films on which a wiring pattern has previously been formed through intermediation of the above-mentioned adhesive films and bonding them together with heating and pressing, the adhesive film can sufficiently flow and the wiring pattern can be embedded without forming any level difference around the pattern area and without generation of voids. Since the composition has a sufficient fluidity, it has a high adhesive force to conductor, wiring film, etc., and there can be formed a multilayer wiring substrate excellent in reliability. Further, since the bismaleimide compound thermally polymerizes to form a heat-resistant skeleton, there can be obtained a multilayer wiring substrate having a high heat resistance enough to endure the pin treatment step at 330° C. for 20 minutes.

Next, as a result of detailed studies on the structure of bismaleimide compounds, it has been found that a bismaleimide compound having a structure of the following formula (1):

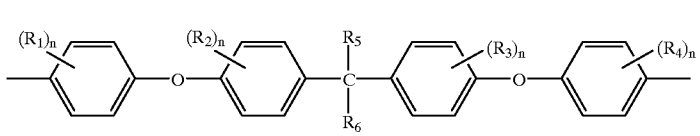

(1)

wherein $R_1$ to $R_6$ and n are as defined above, is excellent in compatibility with polyquinoline compound. That is, a bismaleimide compound having a structure of the formula (1):

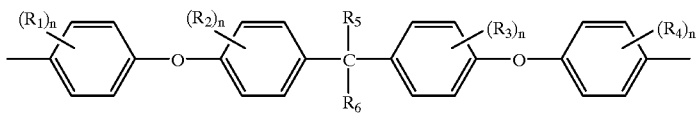

(1)

wherein $R_1$ to $R_6$ and n are as defined above, uniformly dissolves the polyquinoline compound and flows, so that there can be obtained a resin composition excellent in adhesiveness to the body to be bonded and in mechanical properties.

As above, a multilayer wiring prepared by piling two or more layers of films on which a wiring pattern has been formed through intermediation of the above-mentioned adhesive material to make a multilayer laminate and then forming a through-hole conductor part is excellent in reliability.

Further, after detailed studies on the structure of polyquinoline compounds, it has been found that, by using a polyquinoline compound having structures of the following formulas (2) or (3):

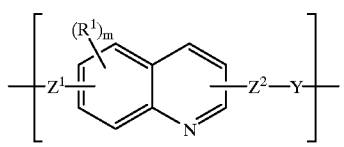

(2)

wherein $R^1$, $Z^1$, $Z^2$, Y and m are as defined above,

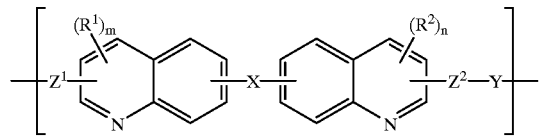

(3)

wherein $R^1$, $R^2$, $Z^1$, $Z^2$, Y, m and n are as defined above, there can be obtained an adhesive composition excellent in wiring pattern-embedding performance and adhesiveness to conductor and wiring film, and a multilayer wiring formed by laminating two or more layers of films on which a wiring pattern has been formed through intermediation of the above-mentioned adhesive material and forming a through-hole conductor part therein has a high reliability.

Next, by forming the above-mentioned multilayer wiring substrate on a wiring substrate having a small thermal expansion coefficient such as polyimide multilayer wiring substrate, glass ceramics multilayer wiring substrate, alumina ceramics multilayer wiring substrate, mullite ceramics multilayer wiring substrate or the like, there can be obtained a multilayer wiring substrate simultaneously fulfilling both the requirements of low thermal expansion and high density and usable in many fields.

As the quinoline compounds usable in the present invention, there can be referred to, for example:

polymer constituted of 2-(2-fluorophenyl)-5-fluoro-4-phenylquinoline,
polymer constituted of 2-(4-fluorophenyl)-5-fluoro-4-phenylquinoline,
polymer constituted of 4-(2-fluorophenyl)-5-fluoro-4-phenylquinoline,
polymer constituted of 2-(4-fluorophenyl)-7-fluoro-4-phenylquinoline,
polymer constituted of 2,4-difluoroquinoline,
polymer constituted of 2,5-difluoroquinoline,
polymer constituted of 2,7-difluoroquinoline,
polymer constituted of 2,7-difluoro-6-phenylquinoline,
polymer constituted of 4-(4-fluorophenyl)-7-fluoroquinoline,
polymer constituted of 6,6'-bis[2-(2-fluorophenyl)-4-phenylquinoline],
polymer constituted of 6,6'-bis[2-(4-fluorophenyl)-4-phenylquinoline], polymer constituted of 6,6-bis[2-(4-fluorophenyl)-4-tert-butylquinoline], polymer constituted of 6,6'-bis[4-(4-fluorophenyl)-2-phenylquinoline], polymer constituted of 6,6'-bis-2-fluoroquinoline, polymer constituted of 6,6'-bis-4-fluoroquinoline, polymer constituted of 6,6'-bis[4-(4-fluorophenyl)-2-(2-pyridyl)quinoline], polymer constituted of 6,6'-bis[4-(4-fluorophenyl)-2-(methyl)quinoline], polymer constituted of 6,6'-bis[2-fluoro-4-phenylquinoline], polymer constituted of oxy-6,6'-bis[2-(4-fluorophenyl)-4-phenylquinoline], polymer constituted of 1,4-benzene-bis-2,2-[2-(4-fluorophenyl)quinoline], polymer constituted of 1,4-benzene-bis-2,2-[4-fluoroquinolin], polymer constituted of 1,4-benzene-bis-2,2-[4-(4-fluorophenyl)quinoline], 1,1,1,3,3,3-hexafluoroisopropylidene-bis[(4-phenoxy-4-phenyl)-2-(4-fluoroquinoline)], and the like. These polymers are used either alone or in combination of two or more.

As non-limitative examples the bismaleimide compound, for example, there can be referred to:

bifunctional maleimide compounds exemplified by N,N'-ethylenedimaleimide,

N,N'-hexamethylenebismaleimide,

N,N'-dodecamethylenebismaleimide,

N,N'-m-xylylenebismaleimide,

N,N'-p-xylylenebismaleimide,

N,N'-1,3-bismethylenecyclohexanebismaleimide,

N,N'-1,4-bismethylenecyclohexanebismaleimide,

N,N'-2,4-tolylenebismaleimide,

N,N'-2,6-tolylenebismaleimide,

N,N'-3,3-diphenylmethanebismaleimide,

N,N'-4,4-diphenylmethanebismaleimlde, 3,3-diphenylsulfonebismaleimide, 4,4-diphenylsulfonebismaleimide, N,N'-4,4-diphenylsulfide-bismaleimide, N,N'-4,4-p-benzophenonebismaleimide, N,N'-diphenylethanebismaleimide, N,N'-diphenylether-bismaleimide, N,N'-(methylene-ditetrahydrophenyl)bismaleimide, N,N'-(3-ethyl)-4,4-diphenylmethanebismaleimide, N,N'-(3,3-dimethyl)-4,4-diphenylmethane-bismaleimide, N,N'-(3,3-diethyl) -4,4-dephenylmethane-bismaleimide, N,N'-(3,3-dichloro)-4,4-diphenylmethane-bismaleimide, N,N'-tolidine-bismaleimide, N,N'-isophorone-bismaleimide, N,N'-p,p'-diphenyldimethylsilyl-bismaleimide, N,N'-benzophenone-bismaleimide, N,N'-diphenylpropane-bismaleimide, N,N'-naphthalene-bismaleimide, N,N'-m-phenylene-bismaleimide, N,N'-4,4-(1,1-diphenyl-cyclohexane)-bismaleimide, N,N'-3,5-(1,2,4-triazole)-bismaleimide, N,N'-pyridin-2,6-diyl-bismaleimide, N,N'-5-methoxy-1,3-phenylene-bismaleimide, 1,2-bis(2-maleimidoethoxy)-ethane, 1,3-bis(3-maleimidopropoxy)-propane, N,N'-4,4-diphenylmethane-bis-dimethylmaleimide, N,N-hexamethylene-bis-dimethylmaleimide, N,N'-4,4'-(diphenylether)-bis-dimethylmaleimide, N,N'-4,4'-(diphenylsulfone)-bis-dimethylmaleimide, N,N'-bismaleimide of N,N'-4,4'-(diamino)-triphenyl phosphate, and the like;

polyfunctional maleimide compounds obtained by reacting maleic anhydride with aniline-formaldehyde reaction product (polyamine compound), 3,4,4'-triaminodiphenylmethane, triaminophenol and the like;

maleimide compounds obtained by reacting maleic anhydride with tris(4-aminophenyl) phosphate, tris(4-aminophenyl) phosphate, tris(4-aminophenyl) thiophosphate and the like; and aromatic bismaleimide compounds such as:

2,2-bis[4-(4-maleimidophenoxy)phenyl]-propane, 2,2-bis[3-chloro-4-(4-maleimidophenoxy)phenyl]-propane, 2,2-bis[3-bromo-4-(4-maleimidophenoxy)phenyl]-propane, 2,2-bis[3-ethyl-4-(4-maleimidophenoxy)phenyl]-propane, 2,2-bis[3-propyl-4-(4-maleimidophenoxy)phenyl]-propane, 2,2-bis[3-isopropyl-4-(4-maleimidophenoxy)phenyl]-propane, 2,2-bis[3-butyl-4-(4-maleimidophenoxy)phenyl]-propane, 2,2-bis[3-sec-butyl-4-(4-maleimidophenoxy)phenyl]-propane, 2,2-bis[3-methoxy-4-(4-maleimidophenoxy)phenyl]-propane, 1,1-bis[4-(4-maleimidophenoxy)phenyl]-ethane, 1,1-bis[3-methyl-4-(4-maleimidophenoxy)phenyl]-ethane, 1,1-bis[3-choro-4-(4-maleimidophenoxy)phenyl]-ethane, 1,1-bis[3-bromo-4-(4-maleimidophenoxy)phenyl]-ethane, 1,1-bis[4-(4-maleimidophenoxy)phenyl]-methane, 1,1-bis[3-methyl-4-(4-maleimidophenoxy)phenyl]-methane, 1,1-bis[3-chloro-4-(4-maleimidophenoxy)phenyl]-methane, 1,1-bis[3-bromo-4-(4-maleimidophenoxy)phenyl]-methane, 3,3-bis[4-(4-maleimidophenoxy)phenyl]-pentane, 1,1-bis[4-(4-maleimidophenoxy)phenyl]-propane, 1,1,1,3,3,3-hexafluoro-2,2-bis[4-(4-maleimidophenoxy)-phenyl]-propane, 1,1,1,3,3,3-hexafluoro-2,2-bis[3,5-dimethyl-(4-maleimidophenoxy)phenyl]-propane, 1,1,1,3,3,3-hexafluoro-2,2-bis[3,5-dibromo-(4-maleimidophenoxy)phenyl]-propane, 1,1,1,3,3,3-hexafluoro-2,2-bis[3,5-methyl-(4-maleimidophenoxy)phenyl]-propane, and the like. These bismaleimide compounds may be used either alone or in combination of two or more.

The above-mentioned adhesive film can usually be obtained by dissolving the ingredients in an organic solvent to prepare a varnish, coating the varnish onto a protecting film, and heating and removing the organic solvent. Other methods than above are also considered adoptable.

As the organic solvent, at least one member selected from methyl cellosolve, methyl ethyl ketone, N,N-dimethylformamide, N,N-dimethylacetamide, N-methyl-2-pyrrolidone, quinoline, cyclopentanone, m-cresol, chloroform and the like can be used, for example.

In the present invention, the compounding ratio between the quinoline ring-containing polymer and the bismaleimide compound is preferably so adjusted that the proportion of the quinoline ring-containing polymer is 70 to 30% by weight based on the total solid components. If the amount of the quinoline ring-containing polymer exceeds 70% by weight, the composition is inferior in fluidity even though the film is excellent in flexibility, which deteriorates the wiring pattern-embedding performance and lowers the adhesive force at the interfaces with wiring film and conductor. If the amount of the quinoline ring-containing polymer is smaller than 30% by weight, mechanical properties are inferior and flexibility of film is not good, even though fluidity of the composition is excellent.

As a method for improving the transmission speed of a large-sized computer, a method of decreasing the wiring resistance of multilayer wiring substrate can be referred to. For decreasing the resistance with a fixed kind of conductor, there can be referred to a method of increasing the width of conductor or increasing the thickness thereof. However, increasing the width of conductor makes it difficult to increase wiring density. Accordingly, a method of increasing the thickness of conductor may be useful for decreasing resistance of conductor without making difficult the enhancement of wiring density. If thickness of conductor is increased, however, embedding of pattern into adhesive material becomes insufficient, and voids can be formed in the molded material or irregularity can appear on the pattern surface. In order to overcome this difficulty, there may be thought out a method of increasing the thickness of adhesive material. If thickness of adhesive material is increased, however, formation of fine through-holes, formation of conductor and preparation of multilayer product are become difficult to practice so that formation of multilayer wiring substrate is difficult. According to the present invention, fluidity can be changed by varying the composition of resin, and thereby the problem mentioned above can be solved and a multilayer wiring substrate can be formed without changing thickness of adhesive material.

Next, the invention is explained more concretely with reference to Examples.

EXAMPLE 1

First of all, a polyquinoline compound was prepared.

Thus, 74.3 g of 6,6'-bis[2-(4-fluorophenyl)-4-phenylquinoline], 40.6 g of 4,4'-(1,1,1,3,3,3-hexafluoro-2,2-propylidene)-bisphenol and 25 g of potassium carbonate were charged into a stainless steel-made flask, to which were further added 450 ml of N-methyl-2-pyrrolidone and 90 ml of toluene as solvents. Then, a calcium chloride tube, a water-cooling type cooler equipped with a Dean-Stark tube for removing water, a dry nitrogen gas inlet tube, a mechanical stirrer and a thermometer were attached to the flask. Using an oil bath, the content of the flask was heated under reflux for 24 hours, and the water in the reaction system was distilled off together with toluene for an additional 24 hours. The solution assumed a yellow color in the early stage, which gradually changed to brown, and to black in this stage. Then, the reaction temperature was elevated to 200° C. and reacted for 6 hours. The color of the reacted solution changed from the black color to a deep blue color with an increase in viscosity. Then, the reaction was stopped by adding 650 ml of N-methyl-2-pyrrolidone for the purpose of dilution and cooling the reaction mixture. The polymer solution thus formed was purified by throwing the solution into water and precipitating the polymer. Subsequently, the mixture was stirred in water at 50° C. for 2 hours. After repeating this washing treatment three times, the polymer was collected by filtration and dried for 24 hours in a vacuum drier kept at 60° C. to obtain a polymer in a yield of 101.1 g.

In 70 g of cyclopentanone was dissolved 21 of the polyquinoline compound obtained above. Then, 9 g of 2,2-bis[4-(4-maleimidophenoxy)phenyl]-propane was added and dissolved to obtain a uniform varnish. The varnish thus obtained was uniformly coated onto a polyimide film, and the solvent was removed by drying it in an oven first at 100° C. for 10 minutes and thereafter at 200° C. for 10 minutes. The polyimide film was peeled off to obtain an adhesive film having a thickness of 10 μm.

In order to examine heat stability of the adhesive film obtained above, a part of the adhesive film was cured in an oven kept at 300° C. for one hour, and then allowed to stand in a thermobalance at 330° C. in a nitrogen atmosphere of 100 ml/minute to measure the weight loss upon heating. The result is shown in FIG. 1. As seen in FIG. 1, the loss in weight of the adhesive film, lost by decomposition and vaporization, was less than 0.5%. Accordingly, it can be said that the adhesive film obtained in this example is excellent in heat stability.

Subsequently, three sheets of wiring polyimide film (hereinafter, simply referred to as wiring film) previously prepared by forming wiring having a line/space rate (hereinafter simply referred to as L/S) of 20 μm/20 μm on a copper (5 μm)-clad polyimide film (thickness 12.5 μm) were lamination-bonded in a lump by means of a parallel plates press under conditions of 300° C./60 minutes, 20 kgf/cm$^2$, provided that an adhesive film mentioned above was inserted between every two wiring films, to obtain a sample.

The sample obtained above was cut into three equal pieces. The first piece was examined for irregularity of pattern part and presence or absence of voids; the second piece was examined for occurrence of swelling after dipping in solder bath at 330° C./20 minutes; and the third piece was examined for occurrence of peeling after a heat cycle test (one cycle was −65° C./30 minutes followed by 150° C./30 minutes; 40 cycles in the total). The results are shown in Table 1. Then, one line having a width of 1 cm and a length of 10 cm was formed on a copper (5 μm in thickness)-clad polyimide film (12.5 μm in thickness) and then subjected to a coupling treatment using an aminosilane coupler (concentration 1%). The polyimide film thus prepared was press-bonded with heating onto a Tempax glass (1 mm in thickness) through intermediation of the above-mentioned adhesive film having a size of 10 cm×9 cm under conditions of 300° C./1 h, 20 kgf/cm$^2$, after which the adhesive strength at the interface between the copper layer and the adhesive sheet was measured. The results are shown in Table 1. There was noticeable no formation of void, and no swelling after solder treatment nor peeling occurred. The adhesive strength was as high as 1.2 kgf/cm.

EXAMPLE 2

A sample was prepared by laminating 5 sheets of the same wiring polyimide film as used in Example 1 in a lump through intermediation of the same adhesive films as in Example 1 on a glass ceramics multilayer wiring substrate, by means of a parallel plates press with heating and pressing (conditions: 300° C./60 minutes, 20 kgf/cm$^2$).

The sample thus obtained was cut into three equal pieces. The first piece was examined for irregularity of pattern part and formation of voids; the second piece was examined for swelling after dipping in a solder bath at 330° C./20 minutes; and the third piece was examined for peeling after a heat cycle test (one cycle: −65° C./30 minutes followed by 150° C./30 minutes; 40 cycles in the total). The results are shown in Table 1. As seen, no voids were formed, and no swelling after solder treatment nor peeling was noticeable.

EXAMPLE 3

The method for preparing a multilayer wiring substrate by lamination, using the adhesive film of Example 2. will be explained with reference to FIG. 2. A two-layered film 3 (Cr/Cu: 0.3 μm/5 μm) was formed on a glass ceramics substrate 2 having an inner layer wiring 1. by the method of sputtering. Then, a resist film 4 was provided, and a wiring 5 (L/S=20 μm/20 μm, pad=120 μm) was prepared by etching. Four sheets of the same polyimide film 6 as used in Example 2 were laminated through intermediation of adhesive films 7 and heated and pressed (300° C./60 minutes, 20 kgf/cm$^2$) in a lump by means of a parallel plates press. Subsequently, φ30 μm through-holes 8 were formed by the mask projection method using excimer laser (KrF: 248 nm), and continuity between the layers was achieved by sputtering of copper to obtain a multilayer wiring substrate. The results of observation are shown in Table 2. As seen, there was no void between patterns, and no peeling was noticeable at interfaces. Further, even after the pin heat treatment, no cracking nor swelling was observed at the through-hole parts.

EXAMPLE 4

A uniform varnish was prepared by dissolving 18 g of the polyquinoline compound obtained in Example 1 in 70 g of cyclopentanone and adding and dissolving 12 g of 2,2-bis[4-(4-maleimidophenoxy)phenyl]-1,1,1,3,3,3-hexafluoropropane. The varnish thus obtained was uniformly coated onto a polyimide film and the solvent was removed by drying it in an oven first at 100° C. for 10 minutes and then at 170° C. for 10 minutes. The polyimide film was peeled off to obtain an adhesive film having a A thickness of 10 μm.

Five sheets of wiring polyimide film prepared by forming wirings of L/S=20 μm/20 μm on a copper (10 μm)-clad polyimide film (12.5 μm in thickness) (hereinafter, simply referred to as wiring film) were lamination-bonded in a lump through intermediation of the adhesive film obtained above, by means of a parallel plates press (conditions: 300° C./60 minutes, 20 kgf/cm$^2$) to obtain a sample.

The sample obtained above was cut into three equal pieces. The first piece was examined for irregularity of pattern part and formation of voids; the second piece was examined for swelling after dipping in a solder bath at 330° C. for 20 minutes; and the third piece was examined for peeling after a heat cycle test (one cycle: −65° C./30 minutes followed by 150° C./30 minutes; 40 cycles in the total). The results are shown in Table 1. Further, a line having a width of 1 cm and a length of 10 cm was formed on a copper (5 μm in thickness)-clad polyimide film (12.5 μm in thickness) and then the polyimide film was subjected to a coupling treatment using an aminosilane coupler (concentration 1%), and heated and pressed onto a Tempax glass (1 mm in thickness) through intermediation of the above-mentioned adhesive films (10 cm×9 cm) under conditions of 300° C./1 h, 20 kgf/cm$^2$, after which the adhesive strength at the interface between copper layer and adhesive sheet was measured. The results are shown in Table 1. No formation of voids was observed, without swelling after solder treatment nor peeling noticeable. The adhesive strength was 0.7 kgf/cm.

EXAMPLE 5

In this example, a polyquinoline compound different from that used in Example 1 was prepared.

Thus, 114.75 g of 6,6'-bis[2-(4"-fluorophenyl)-4-phenylquinoline], 66.0472 g of 9,9-bis(4-hydroxyphenyl)-fluorene and 39.1 g of anhydrous potassium carbonate were introduced into a 2 liter stainless steel-made flask, to which were further added 705 ml of N-methyl-2-pyrrolidone and 421 ml of toluene as solvents. A calcium chloride tube, a water-cooling type cooler equipped with a Dean-Stark tube for removing water, a dry nitrogen gas inlet tube, a mechanical stirrer and a thermometer were attached to the flask. Using an oil bath, the content of the flask was heated under reflux for 15 hours, while removing the water in the system together with toluene. Then, the system was heated at 200° C. for 12 hours. Then, the reaction mixture was diluted with N-methyl-2-pyrrolidone, and slowly poured into three times its volume of acetone to coagulate the polymer. The polymer was collected by filtration, dissolved in N-methyl-2-pyrrolidone and then coagulated with three times its volume of water. After filtration, the polymer obtained was vacuum dried at 130° C. for 12 hours to obtain 170 g of the objective polyquinoline compound.

The polyquinoline compound thus obtained (21 g) was dissolved in 70 g of N-methyl-2-pyrrolidone, and then 9 g of bis(4-maleimidophenyl)-methane was added and dissolved to obtain a uniform varnish. The varnish thus obtained was uniformly coated onto a polyimide film and the solvent was removed by drying it in an oven first at 100° C. for 10 minutes and then at 200° C. for 10 minutes. The polyimide film was peeled off, and there was obtained an adhesive film having a thickness of 10 μm.

Subsequently, three sheets of the same wiring polyimide film as in Example 1 (hereinafter simply referred to as wiring film) were lamination-bonded in a lump through intermediation of the adhesive films obtained above by means of a parallel plates press under conditions of 300° C./60 minutes, 20 kgf/cm$^2$, to obtain a sample.

The sample obtained above was cut into three equal pieces. The first piece was examined for irregularity of pattern part and formation of voids; the second piece was examined for swelling after dipping in a solder bath at 330° C. for 20 minutes; and the third piece was examined for peeling after a heat cycle test (one cycle: −65° C./30 minutes followed by 150° C./30 minutes; 40 cycles in the total). The results are shown in Table 1. Further, a line having a width of 1 cm and a length of 10 cm was formed on a copper (5 μm in thickness)-clad polyimide film (12.5 μm in thickness) and then the polyimide film was subjected to a coupling treatment using an aminosilane coupler (concentration 1%), and heated and pressed onto a Tempax glass (1 mm in thickness) through intermediation of the above-mentioned adhesive films (10 cm×9 cm) under conditions of 300° C./1 h, 20 kgf/cm$^2$, after which the adhesive strength at the interface between copper layer and adhesive sheet was measured. The results are shown in Table 1. No formation of voids was observed, without swelling after solder treatment nor peeling noticeable. The adhesive strength was 0.7 kgf/cm.

EXAMPLE 6

Eighteen grams of the polyquinoline compound obtained in Example 5 was dissolved in 70 g of cyclopentanone, and 12 g of 2,2-bis[4-(4-maleimidophenoxy)phenyl]-propane was added and dissolved to obtain a uniform varnish. The varnish was uniformly coated onto a polyimide film and the solvent was removed by drying it in an oven first at 100° C. for 10 minutes and then at 170° C. for 10 minutes. The polyimide film was peeled off, and there was obtained an adhesive film having a thickness of 10 μm.

In order to examine the heat stability, a part of the adhesive film obtained above was cured in an oven at 300° C. for one hour, and allowed to stand in a thermobalance at 330° C. in a nitrogen atmosphere of 100 ml/minute to measure the weight loss upon heating. The result is shown in FIG. 1. The loss in weight of the adhesive film lost by decomposition and vaporization upon heating was less than 0.5%. Accordingly, it can be said that the adhesive film obtained in this Example is excellent in heat stability.

Subsequently, three sheets of the same wiring polyimide film as in Example 4 (hereinafter simply referred to as wiring film) were lamination-bonded in a lump through intermediation of the adhesive films obtained above by means of a parallel plates press under conditions of 300° C./60 minutes, 20 kgf/cm$^2$, to obtain a sample.

The sample obtained above was cut into three equal pieces. The first piece was examined for irregularity of pattern part and formation of voids; the second piece was examined for swelling after dipping in a solder bath at 330° C. for 20 minutes; and the third piece was examined for peeling after a heat cycle test (one cycle: −65° C./30 minutes followed by 150° C./30 minutes; 40 cycles in the total). The results are shown in Table 1. Further, a line having a width of 1 cm and a length of 10 cm was formed on a copper (5 μm in thickness)-clad polyimide film (12.5 μm in thickness) and then the polyimide film was subjected to a coupling treatment using an aminosilane coupler (concentration 1%), and heated and pressed onto a Tempax glass (1 mm in thickness) through intermediation of the above-mentioned adhesive films (10 cm×9 cm) under conditions of 300° C./1 h, 20 kgf/cm$^2$, after which the adhesive strength at the interface between copper layer and adhesive sheet was measured. The results are shown in Table 1. No formation of voids was observed, without swelling after solder treatment nor peeling noticeable. The adhesive strength was so excellent as 1.0 kgf/cm.

COMPARATIVE EXAMPLE 1

As a comparative example, an adhesive film was prepared from a thermosetting resin composition prepared by adding a bismaleimide compound to a polyimide compound.

Thus, a three-necked flask equipped with a stirring rod, a cooler and a thermometer was charged with 41.0 g of 2,2-bis[(4-diaminophenoxy)phenyl]-propane. Then, 415 ml of N-methyl-2-pyrrolidone was added to dissolve the content of the flask. While cooling with ice water, 3,3-4,4-benzophenonetetracarboxylic acid dianhydride was added and dissolved in small portions and made to react for 4 hours to prepare a polyamic acid varnish as a polyimide precursor.

Subsequently, in a 200 ml three-necked flask equipped with a stirring rod, a cooler and a thermometer, 10 g of bis(4-maleimideophenyl)-methane was added to 100 g of the varnish obtained above and stirred with the stirring rod for 30 minutes to obtain the objective varnish. The varnish was uniformly coated onto a polyimide film, the solvent was removed by drying it in an oven first at 100° C. for 10 minutes and then at 200° C. for 10 minutes. Then, a further heating was carried out at 180° C. for 30 minutes to make progress an imidation reaction. Then, the polyimide film was peeled off, and there was obtained an adhesive film having a thickness of 10 μm.

In order to examine the heat stability, a part of the adhesive film obtained above was cured in an oven at 250° C. for one hour, and allowed to stand in a thermobalance at 330° C. in a nitrogen atmosphere of 100 ml/minute to measure the weight loss upon heating. The result is shown in FIG. 1. The loss in weight of the adhesive film lost by vaporization upon heating was 3% or more.

Subsequently, three sheets of the same wiring polyimide film as in Example 1 (hereinafter simply referred to as wiring film) were lamination-bonded in a lump through intermediation of the adhesive films obtained above by means of a parallel plates press under conditions of 250° C./60 minutes, 20 kgf/cm$^2$, to obtain a sample.

The sample obtained above was cut into three equal pieces. The first piece was examined for irregularity of pattern part and formation of voids; the second piece was examined for swelling after dipping in a solder bath at 330° C. for 20 minutes; and the third piece was examined for peeling after a heat cycle test (one cycle: −65° C./30 minutes followed by 150° C./30 minutes; 40 cycles in the total). The results are shown in Table 1. Further, a line having a width of 1 cm and a length of 10 cm was formed on a copper (5 μm in thickness)-clad polyimide film (12.5 μm in thickness) and then the polyimide film was subjected to a coupling treatment using an aminosilane coupler (concentration 1%), and heated and pressed onto a Tempax glass (1 mm in thickness) through intermediation of the above-mentioned adhesive films (10 cm×9 cm) under conditions of 250° C./1 h, 20 kgf/cm$^2$, after which the adhesive strength at the interface between copper layer and adhesive sheet was measured. The results are shown in Table 1. Formation of voids was observed, with swelling after solder treatment and noticeable peeling. The adhesive strength was 0.2 kgf/cm.

COMPARATIVE EXAMPLE 2

On a mullite ceramics multilayer wiring substrate, five sheets of the same wiring polyimide film as in Example 1 (hereinafter simply referred to as wiring film) were lamination-bonded in a lump through intermediation of the adhesive films obtained in Comparative Example 1 by means of a parallel plates press under conditions of 250° C./60 minutes, 20 kgf/cm$^2$, to obtain a sample.

The sample obtained above was cut into three equal pieces. The first piece was examined for irregularity of pattern part and formation of voids; the second piece was examined for swelling after dipping in a solder bath at 330° C. for 20 minutes; and the third piece was examined for peeling after a heat cycle test (one cycle: −65° C./30 minutes followed by 150° C./30 minutes; 40 cycles in the total). The results are shown in Table 1. Formation of voids, swelling after solder treatment and peeling were all noticeable.

COMPARATIVE EXAMPLE 3

Using the adhesive sheet of Comparative Example 1, a multilayer wiring substrate was prepared in the same manner as mentioned in the method for preparing multilayer wiring substrate of Example 3. The problems which had arisen are summarized in Table 2. Voids were formed between patterns, and peeling was observed at the interface between conductor and adhesive material. Further, after pin heat treatment, cracks and swelling were observed in the through-hole parts.

TABLE 1

|  | Irregularity in pattern part (μm) | Void | Swelling after solder treatment | Peeling | Adhesive strength (kgf/cm) |
| --- | --- | --- | --- | --- | --- |
| Example 1 | 2.5 | Unnoticeable | Unnoticeable | Unnoticeable | 1.2 |
| Example 2 | 4.0 | Unnoticeable | Unnoticeable | Unnoticeable | — |
| Example 4 | 9.2 | Unnoticeable | Unnoticeable | Unnoticeable | 0.7 |
| Example 5 | 5.9 | Unnoticeable | Unnoticeable | Unnoticeable | 0.7 |
| Example 6 | 5.1 | Unnoticeable | Unnoticeable | Unnoticeable | 1.0 |
| Comparative Example 1 | 6.3 | Noticeable | Noticeable | Noticeable | 0.2 |
| Comparative Example 2 | 5.3 | Noticeable | Noticeable | Noticeable | — |

TABLE 2

| | Problems arising at the time of formation |
| --- | --- |
| Example 1 | No void between patterns; no peeling at interfaces noticeable; even after pin heat treatment, no cracks and swelling observed in through-hole parts. |
| Comparative Example 3 | Voids formed between patterns; peeling noticeable at interface between conductor and adhesive material; cracks and swelling observed in the through-hole parts after pin heat treatment. |

EXAMPLE 7

In this example, a method for producing a multilayer wiring substrate is explained as Example 7 of the present invention. An adhesive film comprising a bismaleimide compound and a polyquinoline compound was used. FIG. 3 illustrates the method of this example.

(1) Multiple sheets of wiring film 6 and multiple sheets of adhesive film 7 were alternately piled up on glass ceramics substrate 2. The wiring sheet 6 was so formed that copper wiring 5 each having a thickness of 5 μm were applied to both sides a polyimide film 9 having a thickness of 12.5 μm. After being heated, the whole became constituting a wiring-carrying resin layer.

(2) Using a parallel plates press 20, a wiring film 6, an adhesive film 7 and a glass ceramics substrate 2 were heated and pressed under conditions of 300° C./60 minutes, 20 kgf/cm². The adhesive film 7 became functioning as an insulating layer 10.

(3) Using excimer laser (KrF: 248 nm), through-holes 8 were formed by the mask projection method. The mask 11 and the wiring pattern on each layer were so designed that they could be connected via the through-holes 8. Alternatively, it was also allowable to give the wiring itself a role of mask, as seen in wiring 12.

(4) Copper was sputtered to cover the inner wall of through-holes 8 with copper 13.

(5) Connection pins 14 were formed on the glass ceramics substrate 2 (330° C., 20 minutes).

The multilayer wiring substrate produced in this example showed no voids nor peeling between the insulating layer 10, wiring 5, polyimide film 9 and glass ceramics substrate 2, and no cracks nor swelling after the pin treatment.

Accordingly, the method of the present invention for producing a multilayer wiring substrate is able to shorten the production process to a great extent, as compared with the prior method according to which a multilayer wiring substrate is produced while forming an insulating layer and a circuit from an organic resin in a layer-by-layer manner.

In a case where the same method as prior one which comprises forming an insulating layer and a circuit from an organic resin in a layer-by-layer manner is adopted, except that the organic resin functioning as an insulating layer is a resin compound containing a bismaleimide compound and a polyquinoline compound, there can be obtained a multilayer wiring substrate of which characteristics are similar to those attainable according to this example, even though the production process cannot be shortened. In another case where a multilayer wiring substrate is produced by piling adhesive films 7 and wiring films 6 and practicing heat-cure in a layer-after-layer manner, too, there can be obtained a multilayer wiring substrate of which characteristics are similar to those attainable according to this example. Though in these cases a heat-curing treatment is carried out at every laminating step, characteristics of the multilayer wiring substrate are maintained even after repeated heat treatments because the resin compound comprising a bismaleimide compound and the polyquinoline compound is superior in heat resistance after cure.

Next, how the adhesive film 7 comprising the bismaleimide compound and the polyquinoline compound changes in the process of the method of Example 7 will be described. FIGS. 4A to 4C are conceptional diagrams illustrating the change of resin composition comprising a bismaleimide compound and a polyquinoline compound.

FIG. 4A: Before being heated, the composition is in a state that a polyquinoline compound which a high-polymeric thermoplastic resin is mixed with a bismaleimide compound which is a low-molecular weight thermosetting resin. Since the bismaleimide compound and the polyquinoline compound are compatible with each other, they are uniformly dissolved mutually. Accordingly, the resin composition has flexibility of the polyquinoline compound and fluidity of the bismaleimide compound.

FIG. 4B: When the resin composition is heated to about 200° C., the bismaleimide compound semi-cures, so that the resin composition reaches a semi-cured state. Even when the composition is heated to about 200° C., neither degradation of polyquinoline compound nor mutual reaction of bismaleimide compound and polyquinoline compound takes place. Adhesive film 7 before cure is in this state.

In the semi-cured state, the adhesive film 7 retains a shape of film and has mechanical strengths and flexibility enough for lamination with wiring film 6. Up to the thermal polymerization temperature of bismaleimide compound, the adhesive film 7 retains fluidity enough for embedding wiring 5 of the wiring film 6, and has a high adhesive force with wiring 5, polyimide film 9 and glass ceramics substrate 2. FIG. 4C: When the resin is further heated to about 300° C., the bismaleimide compound thermally polymerizes and cures, so that the whole resin composition cures. The cured resin composition is a mutually penetrating polymer in which the thermally polymerized maleimide compound and the polyquinoline compound which has been a polymer from the beginning are mixed together uniformly, and there is no mutual reaction between the bismaleimide compound and the polyquinoline compound. Since the thermally polymerized bismaleimide compound constitutes a heat resistant skeleton, the cured resin composition becomes exhibiting a thermal stability, and the thermal decomposition temperature of the composition reaches 470° C.

The adhesive film 7 cures to form an insulating layer 10 as it keeps tightly adherent to insulating film 6 and glass ceramics substrate 2. There are no voids nor peeling between the insulating layer 10 and wiring 5, polyimide film 9 and glass ceramics substrate 2, and the insulating layer 10 is solidly bonded to acquire mechanical strengths. Since the thermal decomposition temperature of insulating layer 10 is 470° C., it is superior in heat resistance to the cured product of the adhesive film of Comparative Example 1 which is a thermosetting resin prepared by adding bismaleimide to a polyimide (thermal decomposition temperature thereof is about 340° C.). Thus, it can sufficiently endure the heating at the time of pin treatment for forming connection pins 14 (330° C., 20 minutes).

Making contrast to the cured adhesive film of Comparative Example 1 (a thermosetting resin prepared by adding bismaleimide to a polyimide) of which glass temperature was about 216° C., the insulating layer 10 had a glass transition temperature of 293° C. That is, insulating film 10 is more difficult to soften than the cured adhesive film of Comparative Example 1. Accordingly, there occurs no breakage of wiring nor interlaminar swelling even if the multilayer wiring substrate is subjected to a heat-applying treatment such as laser processing, metallic film formation, etc. after cure of adhesive film 7.

Accordingly, a multilayer wiring substrate excellent in mechanical strengths, heat resistance and heat stability and high in reliability can be produced by using an adhesive film 7 containing a bismaleimide compound and a polyquinoline compound.

Further, even if the polyimide film 9 softens, no breakage of wiring 5 nor interlaminar swelling occurs because the insulating layer 10 tightly adhering to wiring 5 and polyimide film 9 supports them. Accordingly, a multilayer wiring substrate having a high reliability can be obtained even if a material of low softening point is used as polyimide film 9.

EXAMPLE 8

In this Example, a process for producing a multilayer wiring substrate having two layers of thin film wiring layers is explained.

In this Example, the same adhesive film containing a bismaleimide compound and a polyquinoline compound as prepared in Example 1 was used.

FIGS. 5A to 5F show a process for producing a multilayer wiring substrate of this Example including the following steps:

(1) On a glass ceramic substrate 2, a wiring film 6 was piled via an adhesive film 7. The wiring film 6 comprises a polyimide film 9 having a thickness of 12.5 $\mu$m and a copper wiring 5 having a thickness of 5 $\mu$m on one side of the polyimide film. After heating, the wiring film became a wiring-containing resin layer.

(2) The wiring film 6, adhesive film 7 and glass ceramic substrate 2 were heated under pressure (300° C. for 60 minutes, 40 kgf/cm$^2$). The adhesive film 7 becomes an insulating layer 10.

(3) Through-holes 8 were formed by a laser processing using a mask 11.

(4) Inner walls of the through-holes were coated with a conductor film 21 (e.g. Cr/Cu/Cr).

(5) A resist 22 was formed on the portions except for the through-holes, pads and portions to become wiring.

(6) A conductor 13 was formed by etching, followed by peeling of the resist 22.

The resulting multilayer wiring substrate was subjected to the electroconductivity test. As a result, the multilayer wiring substrate of this Example showed good electrical properties.

Due to the use of an adhesive material comprising a polyquinoline compound and a bismaleimide compound, no voids are formed in the space between lines, and no problem arises in the thermal process of 330° C./20 minutes, and therefore the present invention has a high reliability. Further, since formation can be practiced without problem even if thickness of conductor is increased, a high density wiring can be obtained which makes it possible to lessen the electric resistance. Thus, a multilayer circuit substrate excellent in electrical properties can be obtained, and it can be applied to multitip module multilayer substrate for large-sized computers.

Besides above, the multilayer wiring substrate of the present invention can be used in many fields including multilayer wiring substrate for work station, mounting substrate for small-sized electronic devices such as camera and video for public people's use, high frequency multitip module, etc.

What is claimed is:

1. A multilayer wiring substrate comprising a laminate of wiring-carrying resin layers having a conductor wiring and at least one insulating resin layer interposed between individual wiring carrying resin layers, said insulating resin layer comprising both a bismaleimide compound and a polyquinoline compound.

2. A multilayer wiring substrate according to claim 1, wherein said bismaleimide compound comprises a compound having the following general formula (1) in the structure thereof:

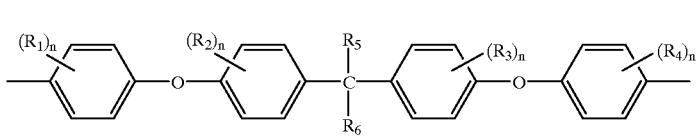

(1)

wherein $R_1$ to $R_6$, identical or different each other, independently represents any one of H, $CH_2$, $CH_3$, $C_2H_5$, $C_3H_7$, F, $CF_3$ and $C_2F_5$; and n, identical or different each other, represents 0 or an integer of 1 to 4.

3. A multilayer wiring substrate according to claim 1, wherein said polyquinoline compound comprises at least one compound selected from those having the following general formulas (2) and (3) in the structure thereof:

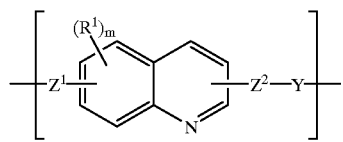

(2)

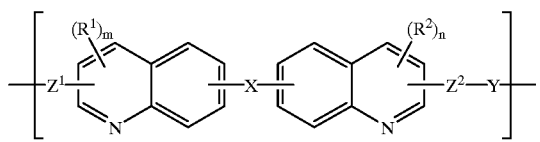

(3)

wherein $R^1$ and $R^2$ independently represents an alkyl group, an aryl group, an alkoxy group, an aryloxy group, a formyl group (—COR), an ester group (—COR or —OCOR), an amido group (—NRCOR or —CONRR), a heteroaryl group, a cyano group or, an $R^1$ and an $R^2$ taken together form a divalent hydrocarbon group which may have an unsaturated bond, provided that R represents a hydrogen atom, an alkyl group or a heteroaryl group; m and n independently represents an integer of from 0 to 5; X represents direct link, —O—, —S—, —CO—, SO—, —$SO_2$—, —A—, (O—A)$_q$—O— or —O— in which q is an integer of from 1 to 3; A represents —Ar— (an arylene group), —Hr— (a heteroarylene group), —Ar—O—Ar—, —CO—Ar—, Ar—S—Ar—, —Ar—SO—Ar—, —Ar— or —Ar—Q—Ar—; Q represents the following formula:

in which $L_1$ and $L_2$ represent a methyl group, a trifluoromethyl group or, an $L_1$ and an $L_2$ taken together form a divalent hydrocarbon group which may have an unsaturated bond; $Z^1$ and $Z^2$ independently represents direct link or an arylene group; and Y represents —O— or —O—A—O—.

4. A multilayer wiring substrate according to claim 1, wherein said insulating resin layer is interposed between the multilayer wiring substrate of claim 1 and a polyimide multilayer wiring substrate, a glass ceramics multilayer wiring substrate, an alumina ceramics multilayer wiring substrate or a mullite glass multilayer wiring substrate and said wiring-carrying resin layer.

5. A method for producing a multilayer wiring substrate in which a wiring-carrying resin layer having a wiring conductor and an insulating resin layer are laminated, which comprises:

a step of laminating a wiring-carrying resin layer prepared by forming a wiring pattern on an insulating film and an insulating resin layer, and a step of pressing the above-obtained laminate of wiring-carrying resin layer and the insulating resin layer with heating, wherein said insulating resin layer comprises both a bismaleimide compound and a polyquinoline compound.

6. A method for producing a multilayer wiring substrate according to claim 5, wherein said laminate has a polyimide multilayer wiring substrate, a glass ceramics multilayer wiring substrate, an alumina ceramics wiring substrate or a mullite glass multilayer wiring substrate, and said method comprises:

a step of forming holes through the laminate, a step of attaching a conductor onto the inner wall of said holes, and a step of forming a metallic conductor on said polyimide multilayer wiring substrate, said glass ceramics multilayer wiring substrate, said alumina ceramics multilayer wiring substrate or said mullite glass multilayer wiring substrate.

7. A multilayer wiring substrate according to claim 1, wherein the insulating resin layer includes 30%–70% by weight polyquinoline compound, of the total of bismaleimide compound and polyquinoline compound.

8. A multilayer wiring substrate according to claim 3, wherein the $R^1$ and the $R^2$, taken together, form a ring; and the $L_1$ and the $L_2$, taken together, form a ring.

9. A multilayer wiring substrate according to claim 2, wherein the bismaleimide compound is at least one member selected from the group consisting of N,N'-4,4-diphenylmethanebismaleimide, 2,2-bis (4-(4-maleimidophenoxy)phenyl)-propane, and 1,1,1,3,3,3-hexfluoro-2,2-bis (4-(4-maleimidophenoxy)phenyl) propane.

10. A multilayer wiring substrate according to claim 3, wherein the polyquinoline compound is represented by the formula (3), in which $Z^1$ is a phenylene group; $R^1$ is a phenyl group; m is an integer of 1; X is direct link; $R^2$ is a phenyl group; n is an integer of 1; $Z^2$ is a phenylene group; Y is —O—A—O—; A is —Ar—Q—Ar—; Ar is a phenylene group; Q is a group of the formula:

in which $L_1$ and $L_2$ are each trifluoromethyl group or, $L_1$ and $L_2$ taken together form a divalent hydrocarbon group which has unsaturated bonds.

11. A multilayer wiring substrate according to claim 10, wherein the polyquinoline compound is a polymer constituted of 6,6'-bis(2-(4-fluorophenyl)-4-phenylquinoline).

12. A multilayer wiring substrate according to claim 1, wherein the bismaleimide compound is N,N'-4,4- diphenylmethanebismaleimide or 2,2-bis(4-(4-maleimidophenoxy)-phenyl) propane, and the polyquinoline compound is a polymer obtained from (1) 6,6'-bis(2-(4-fluorophenyl)-4-phenylquinoline) and (2a) 4,4'-(1,1,1,3,3,3,-hexafluoro-2,2-propylidene)-bisphenol or (2b) 9,9-bis(4-hydroxyphenyl)-fluorene.

* * * * *